US012761008B2

(12) United States Patent
Moriya et al.

(10) Patent No.: US 12,761,008 B2
(45) Date of Patent: Oct. 13, 2026

(54) SUBSTRATE THICKNESS MEASURING DEVICE, SUBSTRATE PROCESSING SYSTEM, AND SUBSTRATE THICKNESS MEASURING METHOD

(71) Applicant: Tokyo Electron Limited, Tokyo (JP)

(72) Inventors: Teruhiko Moriya, Kikuchi-gun (JP); Keisuke Hamamoto, Koshi City (JP); Yohei Maeda, Koshi City (JP)

(73) Assignee: Tokyo Electron Limited, Tokyo (JP)

( * ) Notice: Subject to any disclaimer, the term of this patent is extended or adjusted under 35 U.S.C. 154(b) by 295 days.

(21) Appl. No.: 18/681,914

(22) PCT Filed: Jul. 28, 2022

(86) PCT No.: PCT/JP2022/029189
§ 371 (c)(1),
(2) Date: Feb. 7, 2024

(87) PCT Pub. No.: WO2023/017744
PCT Pub. Date: Feb. 16, 2023

(65) Prior Publication Data

US 2024/0369339 A1 Nov. 7, 2024

(30) Foreign Application Priority Data

Aug. 10, 2021 (JP) ............................. JP2021-130839

(51) Int. Cl.
*G01B 5/00* (2006.01)
*G01B 11/06* (2006.01)
(Continued)

(52) U.S. Cl.
CPC ............ *G01B 5/0014* (2013.01); *G01B 11/06* (2013.01); *H10P 72/0418* (2026.01);
(Continued)

(58) Field of Classification Search
CPC .. G01B 5/0014; G01B 11/06; G01B 2210/56; H10P 72/0418; H10P 72/0602; H10P 72/0604; H10P 74/203
See application file for complete search history.

(56) References Cited

U.S. PATENT DOCUMENTS 10,571,249 B1 * 2/2020 Nimtsch ............ G01B 9/02021
2001/0014372 A1 * 8/2001 Katano ............... H10P 72/0458
118/69
(Continued)

FOREIGN PATENT DOCUMENTS

CN 212495987 U 2/2021
JP H6104155 A 4/1994
(Continued)

OTHER PUBLICATIONS

International Search Report of PCT/JP2022/029189 dated Oct. 11, 2022.

*Primary Examiner* — Michael A Lyons
(74) *Attorney, Agent, or Firm* — Shih IP Law Group, PLLC.

(57) ABSTRACT

A substrate thickness measuring device includes a substrate holder, a thickness measurer, a housing, a temperature measurer and a thickness corrector. The substrate holder is configured to hold a substrate. The thickness measurer is configured to measure a thickness of the substrate held by the substrate holder. The housing accommodates therein the substrate holder and at least a part of the thickness measurer. The thickness corrector is configured to correct the thickness measured by the thickness measurer. The thickness corrector performs: calculating, as a corrected thickness, a product of the thickness measured by the thickness measurer and a preset correction coefficient, and changing a setting of the
(Continued)

correction coefficient when the temperature measured by the temperature measurer falls out of a preset allowable range.

11 Claims, 11 Drawing Sheets

(51) Int. Cl.
*H10P 72/00* (2026.01)
*H10P 74/20* (2026.01)

(52) U.S. Cl.
CPC ...... *H10P 72/0602* (2026.01); *H10P 72/0604* (2026.01); *H10P 74/203* (2026.01); *G01B 2210/56* (2013.01)

(56) References Cited

U.S. PATENT DOCUMENTS

2006/0166503 A1* 7/2006 Sasaki .................... B24B 49/03 438/692
2020/0016720 A1* 1/2020 Nakamura ............ B24B 37/005
2021/0280429 A1 9/2021 Ookawa
2022/0392814 A1* 12/2022 Watanabe ........... H10P 72/0602

FOREIGN PATENT DOCUMENTS

JP 2000-258118 A 9/2000
JP 2010-136478 A 6/2010
JP 2011-071423 A 4/2011
JP 2012-185132 A 9/2012
JP 2013-137197 A 7/2013
JP 2019-062003 A 4/2019
JP 2020-034291 A 3/2020
JP 2021-034533 A 3/2021
WO 2020022187 A1 1/2020

* cited by examiner

SUBSTRATE THICKNESS MEASURING DEVICE, SUBSTRATE PROCESSING SYSTEM, AND SUBSTRATE THICKNESS MEASURING METHOD

CROSS-REFERENCE TO RELATED APPLICATIONS

This Application is a U.S. national phase application under 35 U.S.C. § 371 of PCT Application No. PCT/JP2022/029189 filed on Jul. 28, 2022, which claims the benefit of Japanese Patent Application No. 2021-130839 filed on Aug. 10, 2021, the entire disclosures of which are incorporated herein by reference.

TECHNICAL FIELD

The various aspects and embodiments described herein pertain generally to a substrate thickness measuring device, a substrate processing system, and a substrate thickness measuring method.

BACKGROUND

A film thickness measuring device described in Patent Document 1 includes a film thickness measurer that measures a film thickness of a film formed on a surface of a substrate, a humidity measurer that measures humidity around the film thickness measurer, a storage that stores therein information upon a correlation between the humidity and the film thickness, and a corrector that calculates a first correction amount for correcting a measurement value of the film thickness from the humidify measured by the humidity measurer and the information stored in the storage and corrects the measurement value of the film thickness measured by the film thickness measurer with the calculated first correction amount.

Patent Document 1: Japanese Patent Laid-open Publication No. 2019-062003

SUMMARY

In an exemplary embodiment, a substrate thickness measuring device includes a substrate holder, a thickness measurer, a housing, a temperature measurer and a thickness corrector. The substrate holder is configured to hold a substrate. The thickness measurer is configured to measure a thickness of the substrate held by the substrate holder. The housing accommodates therein the substrate holder and at least a part of the thickness measurer. The thickness corrector is configured to correct the thickness measured by the thickness measurer. The thickness corrector performs: calculating, as a corrected thickness, a product of the thickness measured by the thickness measurer and a preset correction coefficient, and changing a setting of the correction coefficient when the temperature measured by the temperature measurer falls out of a preset allowable range.

DETAILED DESCRIPTION

Figure 1:
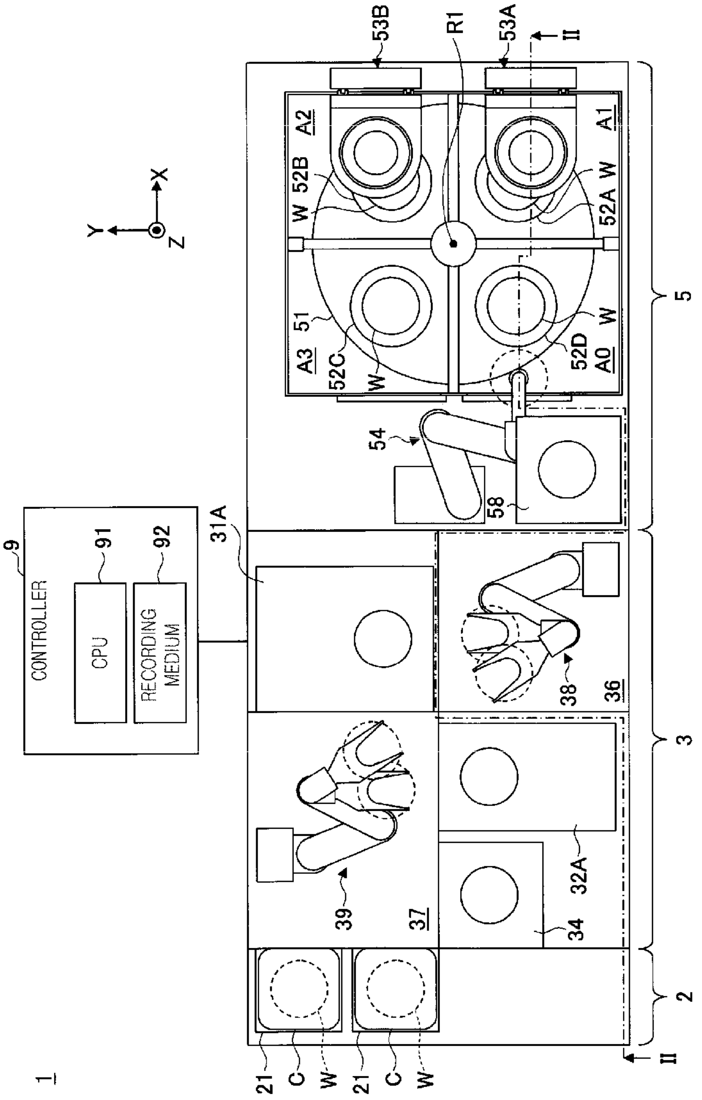
FIG. 1 is a plan view illustrating a substrate processing system according to an exemplary embodiment.

Hereinafter, exemplary embodiments of the present disclosure will be described with reference to the accompanying drawings. In the various drawings, same or corresponding parts will be assigned same or corresponding reference numerals, and redundant description will be omitted. In the present specification, the X-axis direction, the Y-axis direction and the Z-axis direction are orthogonal to each other. The X-axis and Y-axis directions are horizontal directions, and the Z-axis direction is a vertical direction.

First, referring to FIG. 1 and FIG. 2, a substrate processing system 1 according to an exemplary embodiment will be described. The substrate processing system 1 is configured to grind a substrate W. In the present specification, the grinding includes polishing. The substrate processing system 1 includes a carry-in/out block 2, a cleaning block 3, and a grinding block 5. The carry-in/out block 2, the cleaning block 3, and the grinding block 5 are arranged in this order from the negative X-axis side to the positive X-axis side.

The carry-in/out block 2 includes a placement table 21 where a cassette C accommodating the substrate W therein is placed. The cassette C horizontally accommodates a plurality of substrates W that are arranged at a certain distance therebetween in a vertical direction. The substrate W includes a semiconductor substrate such as a silicon wafer or a compound semiconductor wafer, or a glass substrate. The substrate W may further include a device layer formed on a surface of the semiconductor substrate or the glass substrate. The device layer includes an electronic circuit. Further, the substrate W may be a combined substrate in which a plurality of substrates are bonded together.

Figure 2:
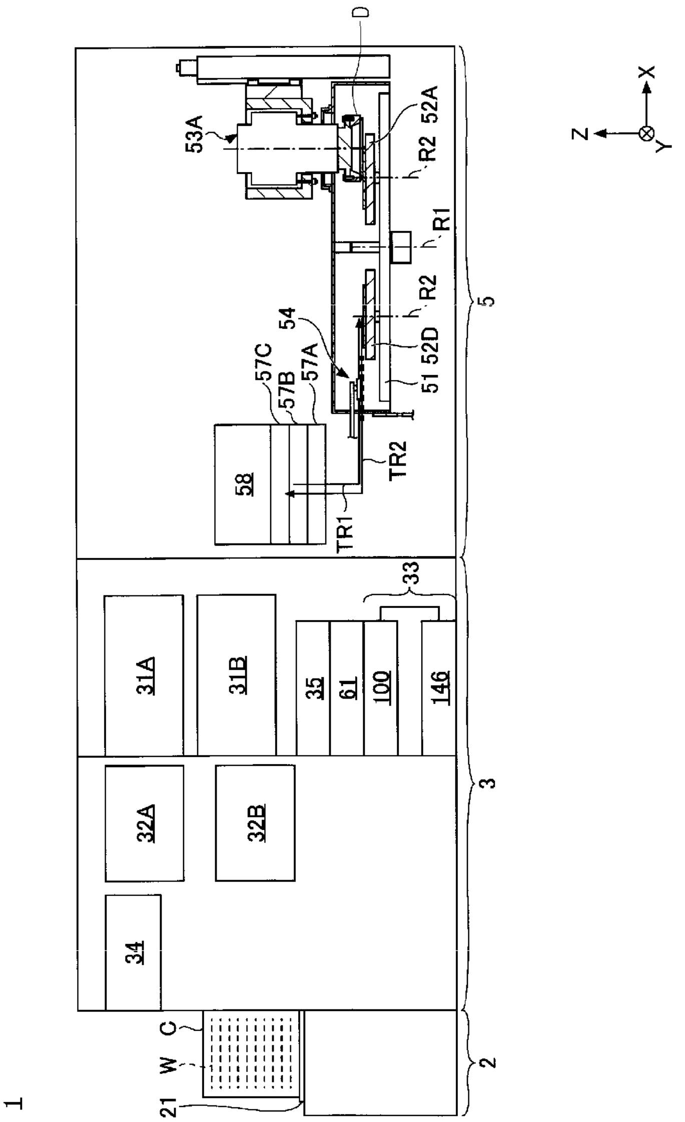
FIG. 2 is a cross sectional view taken along a line II-II of FIG. 1.

The cleaning block 3 includes, as shown in FIG. 1 and FIG. 2, cleaning devices 31A and 31B configured to clean the substrate W after being ground, etching devices 32A and 32B configured to etch the substrate W after being cleaned, a substrate thickness measuring device 33 configured to measure a thickness of the substrate W after being etched, an inverting device 34 configured to invert the substrate W, a transition device 35 configured to temporarily store the substrate W, and a storage device 61 configured to store a calibration substrate to be described later. The calibration substrate is used to correct the thickness of the substrate W measured by the substrate thickness measuring device 33. Further, the cleaning block 3 includes a first transfer area 36 and a second transfer area 37. A first transfer device 38 is provided in the first transfer area 36, and a second transfer device 39 is provided in the second transfer area 37. The first transfer device 38 is configured to transfer the substrate W between the cleaning devices 31A and 31B and the grinding block 5. The second transfer device 39 transfers the substrate W between the cassette C on the placement table 21 and the cleaning block 3.

The cleaning devices 31A and 31B, the transition device 35, the storage device 61, and the substrate thickness measuring device 33 are stacked in a vertical direction, and are disposed at a position surrounded by the first transfer area 36, the second transfer area 37, and the grinding block 5. The cleaning devices 31A and 31B, the transition device 35, the storage device 61, and the substrate thickness measuring device 33 are stacked in this order from top to bottom. However, the order is not particularly limited. Further, the etching devices 32A and 32B are stacked in a vertical direction and are arranged adjacent to the first transfer area 36 and the second transfer area 37.

The first transfer device 38 is configured to transfer the substrate W in the first transfer area 36. That is, the first transfer device 38 transfers the substrate W between multiple devices arranged next to the first transfer area 36. The first transfer device 38 has a plurality of transfer arms configured to be moved independently. Each transfer arm is movable in horizontal directions (both in the X-axis direction and in the Y-axis direction) and a vertical direction, and pivotable around a vertical axis. Each transfer arm holds the substrate W from below. Further, the number of the transfer arms is not particularly limited.

Likewise, the second transfer device 39 is configured to transfer the substrate W in the second transfer area 37. That is, the second transfer device 39 transfers the substrate W between multiple devices arranged next to the second transfer area 37. The second transfer device 39 has a plurality of transfer arms configured to be moved independently. Each transfer arm is movable in horizontal directions (both in the X-axis direction and the Y-axis direction) and a vertical direction, and pivotable around a vertical axis. Each transfer arm holds the substrate W from below.

As shown in FIG. 1, the grinding block 5 includes, by way of example, four holders 52A, 52B, 52C, and 52D each configured to hold the substrate W; two tool drivers 53A and 53B each configured to drive a grinding tool D configured to grind the substrate W; and an internal transfer device 54 configured to transfer the substrate W within the grinding block 5. The grinding block 5 may further include a rotary table 51 configured to be rotated about a rotation center line R1. The four holders 52A, 52B, 52C, and 52D are arranged at a certain distance therebetween around the rotation center line R1, and is rotated along with the rotary table 51. Also, the four holders 52A, 52B, 52C, and 52D are rotated around their own rotation center lines R2.

The two holders 52A and 52C are arranged symmetrically about the rotation center line R1 of the rotary table 51. Each of the holders 52A and 52C is moved between a first carry-in/out position A3 where the substrate W is carried in and out by the internal transfer device 54, and a first grinding position A1 where the substrate W is ground by the tool driver 53A. The two holders 52A and 52C are moved between the first carry-in/out position A3 and the first grinding position A1 every time the rotary table 51 is rotated 180°.

The other two holders 52B and 52D are arranged symmetrically about the rotation center line R1 of the rotary table 51. Each of the holders 52B and 52D is moved between a second carry-in/out position A0 where the substrate W is carried in and out by the internal transfer device 54 and a second grinding position A2 where the substrate W is ground by the other tool driver 53B. These two holders 52B and 52D are moved between the second carry-in/out position A0 and the second grinding position A2 every time the rotary table 51 is rotated 180°.

When viewed from above, the first carry-in/out position A3, the second carry-in/out position A0, the first grinding position A1, and the second grinding position A2 are arranged in this order in a counterclockwise direction. In this case, when viewed from above, the holder 52A, the holder 52B, the holder 52C, and the holder 52D are arranged in this order at a pitch of 90° in the counterclockwise direction.

In addition, the first carry-in/out position A3 and the second carry-in/out position A0 may be opposite to each other, and the first grinding position A1 and the second grinding position A2 may also be opposite to each other. That is, when viewed from above, the first carry-in/out position A3, the second carry-in/out position A0, the first grinding position A1, and the second grinding position A2 may be arranged in this order in a clockwise direction. In this case, when viewed from above, the holder 52A, the holder 52B, the holder 52C, and the holder 52D are arranged in this order at a pitch of 90° in the clockwise direction.

Here, however, the number of the holders is not limited to four. The number of the tool driver is not limited to two, either. Further, the rotary table 51 may be omitted. For example, instead of the rotary table 51, a slide table may be provided.

The grinding block 5 includes, as illustrated in FIG. 2, temporary storage modules 57A, 57B, and 57C each configured to temporarily store the substrate W therein. The temporary storage modules 57A, 57B, and 57C enables a delivery of the substrate W between the internal transfer device 54 and the first transfer device 38 of the cleaning block 3. The internal transfer device 54 receives the substrate W, which has been handed over to the temporary storage modules 57A and 57B by the first transfer device 38, from the temporary storage modules 57A and 57B. Also, the first transfer device 38 receives the substrate W, which has been handed over to the temporary storage module 57C by the internal transfer device 54, from the temporary storage module 57C.

The temporary storage module 57A (57B) also serves as an alignment device configured to adjust a center position of the substrate W. The alignment device aligns the center position of the substrate W to a required position by using a guide or the like. Afterwards, the substrate W is transferred to a preset carry-in position by the internal transfer device 54, and if the substrate W is handed over to each holder 52A (52B, 52C, 52D) at the carry-in position, the center of the substrate W can be aligned with the center of each holder 52A (52B, 52C, 52D), when viewed from above.

Moreover, the alignment device may detect the center position of the substrate W by using an optical system or the like. In this case, a controller 9 may correct the aforementioned preset carry-in position based on a detection result of the alignment device, thus allowing the center of each holder 52A (52B, 52C, 52D) to be aligned with the center of the substrate W when viewed from above. In addition, the alignment device may detect a crystal orientation of the substrate W by using an optical system or the like, and may specifically detect a notch or orientation flat indicating the crystal orientation of the substrate W. In a rotational coordinate system that is rotated along with each holder 52A (52B, 52C, 52D), the crystal orientation of the substrate W can be aligned to a required direction.

The temporary storage modules 57A and 57B may be stacked on top of each other in a vertical direction in order to reduce the footprint of the substrate processing system 1. The order of stacking the temporary storage modules 57A and 57B is not limited to the shown example, and may be reversed. When the temporary storage modules 57A and 57B also serve as the alignment devices, it is desirable that they include a guide instead of an optical system. This is because, when the temporary storage module 57A (57B) includes the guide, the size of the temporary storage module 57A (57B) in the Z-axis direction can be reduced as compared to a case where the temporary storage module 57A (57B) includes the optical system.

The temporary storage modules 57B and 57C are disposed above transfer paths TR1 and TR2 through which the internal transfer device 54 transfers the substrate W between the temporary storage modules 57B and 57C and the holder (for example, the holder 52D) located at the second carry-in/out position A0. When viewed from above, the temporary storage modules 57B and 57C and the transfer paths TR1 and TR2 overlap.

The grinding block 5 may include an inverting device 58 configured to invert the substrate W. The inverter 58 is disposed above the transfer paths TR1 and TR2. The inverting device 58 and the temporary storage modules 57A, 57B, and 57C are stacked in a vertical direction. For example, the inverting device 58, the temporary storage module 57C, the temporary storage module 57B, and the temporary storage module 57A are stacked in this order from top to bottom. Here, the order of stacking is not particularly limited.

The substrate processing system 1 further includes the controller 9, as shown in FIG. 1. The controller 9 is, for example, a computer, and is equipped with a CPU (Central Processing Unit) 91 and a recording medium 92 such as a memory. The recording medium 92 stores therein a program that controls various processings performed in the substrate processing system 1. The controller 9 controls an operation of the substrate processing system 1 by causing the CPU 91 to execute the program stored in the recording medium 92.

Now, referring to FIG. 3, a substrate processing method performed by the substrate processing system 1 will be discussed. The substrate processing method includes, for example, processes S101 to S111 shown in FIG. 3. The processes S101 to S111 are performed under the control of the controller 9. Further, the substrate processing method does not need to include all the processes shown in FIG. 3, and may include a process not shown in FIG. 3.

First, the second transfer device 39 takes out the substrate W from the cassette C, and transfers it to the transition device 35. Next, the first transfer device 38 receives the substrate W from the transition device 35, and transfers it to the temporary storage module 57A of the grinding block 5. The substrate W has a first main surface and a second main surface facing in opposite directions, and is transferred with the first main surface facing upwards.

Next, the temporary storage module 57A adjusts the center position of the substrate W (process S101). The temporary storage module 57A may detect the center position of the substrate W. Further, the temporary storage module 57A may detect the crystal orientation of the substrate W in addition to the center position of the substrate W. Specifically, the temporary storage module may detect the notch or orientation flat indicating the crystal orientation of the substrate W.

Next, the internal transfer device 54 receives the substrate W from the temporary storage module 57A, and carries it to the holder (for example, the holder 52C) located at the first carry-in/out position A3. The substrate W is placed on the holder 52C with the first main surface thereof facing upwards. At this time, the center of the substrate W and the rotation center line R2 of the holder 52C are aligned. Thereafter, the rotary table 51 is rotated 180°, so that the holder 52C is moved from the first carry-in/out position A3 to the first grinding position A1.

Next, the tool driver 53A drives the grinding tool D to grind the first main surface of the substrate W (process S102). Then, the rotary table 51 is rotated 180°, so that the holder 52C is moved from the first grinding position A1 to the first carry-in/out position A3. Subsequently, the internal transfer device 54 receives the substrate W from the holder 52C located at the first carry-in/out position A3, and transfers it to the inverting device 58.

Next, the inverting device 58 inverts the substrate W (process S103). The substrate W is turned up and down such that the first main surface faces downwards and the second main surface faces upwards. Thereafter, the first transfer device 38 of the cleaning block 3 receives the substrate W from the inverting device 58, and transfers it to the cleaning device 31A.

Then, the cleaning device 31A cleans the first main surface of the substrate W (process S104). Particles such as grinding debris can be removed by the cleaning device 31A. The cleaning device 31A scrub-cleans the substrate W, for example. The cleaning device 31A may clean not only the first main surface but also the second main surface of the substrate W. After the substrate W is dried, the first transfer device 38 receives the substrate W from the cleaning device 31A, and transfers it to the temporary storage module 57B of the grinding block 5.

Next, the temporary storage module 57B adjusts the center position of the substrate W (process S105). The temporary storage module 57B may detect the center position of the substrate W. Further, the temporary storage module 57B may detect the crystal orientation of the substrate W as well as the center position of the substrate W, and may specifically detect the notch or orientation flat indicating the crystal orientation of the substrate W.

Subsequently, the internal transfer device 54 receives the substrate W from the temporary storage module 57B, and carries it to the holder (for example, the holder 52D) located at the second carry-in/out position A0. The substrate W is placed on the holder 52D with the second main surface thereof facing upwards. At this time, the center of the substrate W and the rotation center line R2 of the holder 52D are aligned. Thereafter, the rotary table 51 is rotated by 180°, so that the holder 52D is moved from the second carry-in/out position A0 to the second grinding position A2.

Next, the tool driver 53B drives the grinding tool D to grind the second main surface of the substrate W (process S106). Then, the rotary table 51 is rotated by 180°, so that the holder 52D is moved from the second grinding position A2 to the second carry-in/out position A0. Subsequently, the internal transfer device 54 receives the substrate W from the holder 52D located at the second carry-in/out position A0, and transfers it to the temporary storage module 57C. Thereafter, the first transfer device 38 of the cleaning block 3 receives the substrate W from the temporary storage module 57C, and transfers it to the cleaning device 31B.

Next, the cleaning device 31B cleans the second main surface of the substrate W (process S107). Particles such as grinding debris can be removed by the cleaning device 31B. The cleaning device 31B scrub-cleans the substrate W, for example. The cleaning device 31B may clean not only the second main surface but also the first main surface of the substrate W. After the substrate W is dried, the second transfer device 39 receives the substrate W from the cleaning device 31B, and transfers it to the etching device 32B.

Next, the etching device 32B etches the second main surface of the substrate W (process S108). A grinding mark on the second main surface can be removed by the etching device 32B. After the substrate W is dried, the second transfer device 39 receives the substrate W from the etching device 32B, and transfers it to the inverting device 34.

Then, the inverting device 34 inverts the substrate W (process S109). The substrate W is turned upside down such that the first main surface faces upwards and the second main surface faces downwards. Thereafter, the second transfer device 39 receives the substrate W from the inverting device 34, and transfers it to the etching device 32A.

Next, the etching device 32A etches the first main surface of the substrate W (process S110). A grinding mark on the first main surface can be removed by the etching device 32A. After the substrate is dried, the second transfer device 39 receives the substrate W from the etching device 32A, and transfers it to the substrate thickness measuring device 33.

Subsequently, the substrate thickness measuring device 33 measures the thickness of the substrate W after being etched (process S111). For example, it is checked whether the thickness of the substrate W and the total thickness variation (TTV) of the substrate W are within preset allowable ranges. Thereafter, the second transfer device 39 receives the substrate W from the substrate thickness measuring device 33, and accommodates the received substrate W in the cassette C. Then, the current processing is ended.

Figure 3:
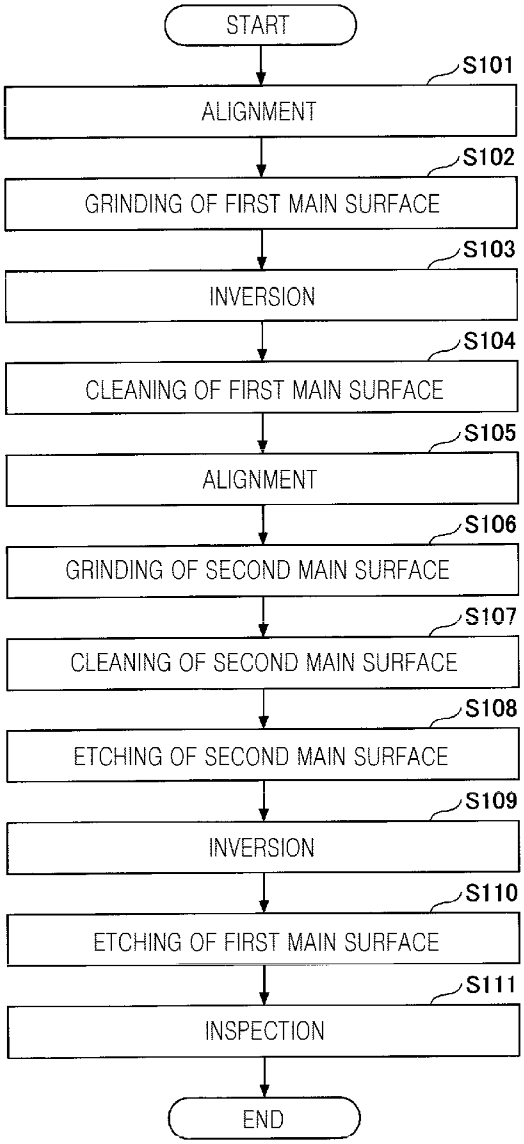
FIG. 3 is a flowchart illustrating a substrate processing method according to the exemplary embodiment.

In the description of FIG. 3, the substrate processing method has been explained for the case of processing the single sheet of substrate W. In order to improve throughput, the substrate processing system 1 may perform multiple processings at multiple positions simultaneously. For example, the substrate processing system 1 simultaneously grinds the substrate W at each of the first grinding position A1 and the second grinding position A2. In the meantime, the substrate processing system 1 performs, for example, spray cleaning of the substrate W, measurement of a plate thickness distribution of the substrate W, carry-out of the substrate W, cleaning of a substrate attracting surface (top surface) of the holder, and carry-in of the substrate W at each of the carry-in/out position A3 and the second carry-in/out position A0.

Thereafter, the substrate processing system 1 rotates the rotary table 51 by 180°. Next, the substrate processing system 1 simultaneously grinds the substrate W again at each of the first grinding position A1 and the second grinding position A2. In the meantime, the substrate processing system 1 performs spray-cleaning of the substrate W, measurement of the plate thickness distribution of the substrate W, carry-out of the substrate W, cleaning of the substrate attracting surface (top surface) of the holder, and carry-in of the substrate W again in this order at each of the first carry-in/out position A3 and the second carry-in/out position A0.

Figure 4:
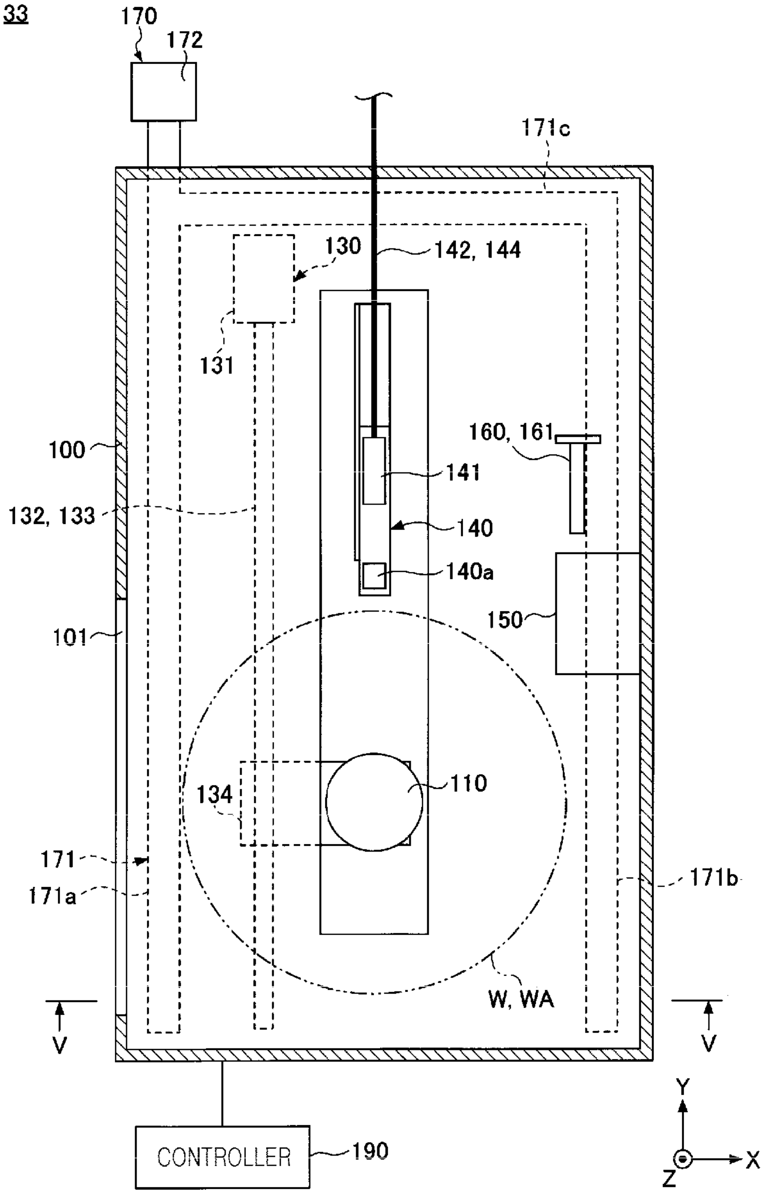
FIG. 4 is a plan view illustrating an example of a substrate thickness measuring device, and is a cross sectional view taken along a line IV-IV of FIG. 5.

Now, referring to FIG. 4 to FIG. 6, the substrate thickness measuring device 33 according to the exemplary embodiment will be explained. The substrate thickness measuring device 33 includes, for example, a housing 100, a substrate holder 110, a rotator 120, a mover 130, a thickness measurer 140, an alignment device 150, a temperature measurer 160, a humidity measurer 161, an exhaust device 170, an inner cover 180, and a controller 190. The controller 190 may be a part of the controller 9.

The housing 100 is, for example, a box body having a rectangular shape when viewed from the top. The housing 100 accommodates therein, for example, the substrate holder 110, the rotator 120, the mover 130, at least a part (for example, a probe 141 to be described later) of the thickness measurer 140, the alignment device 150, the temperature measurer 160, the humidity measurer 161, at least a part (for example, an exhaust duct 171 to be described later) of the exhaust device 170, and the inner cover 180.

A carry-in/out port 101 is formed on a side surface of the housing 100 facing the second transfer area 37. The substrate W and a calibration substrate WA are carried in and out through the carry-in/out port 101. There is no need to provide an opening/closing shutter at the carry-in/out port 101, and the carry-in/out port 101 may always be kept open. A constant airflow can be introduced into the housing 100 from the second transfer area 37 through the carry-in/out port 101, so that the temperature inside the housing 100 can be maintained constant.

Figure 5:
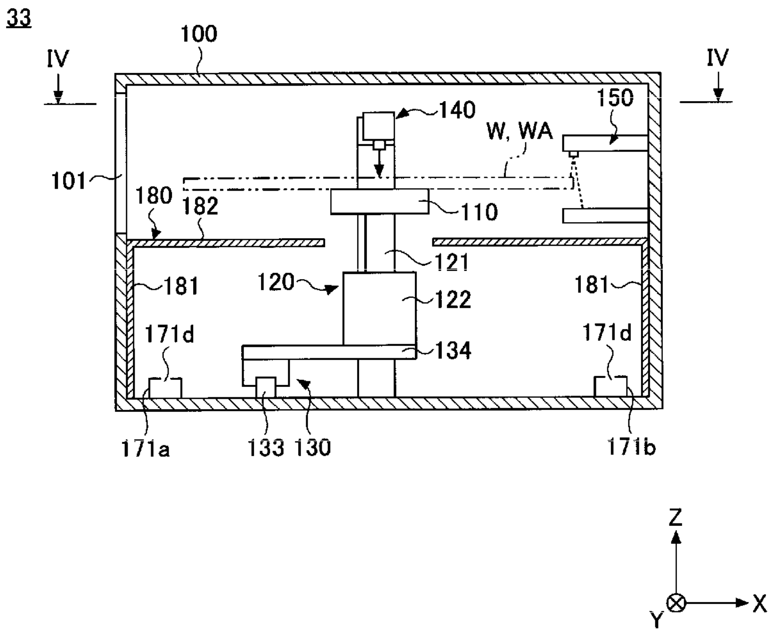
FIG. 5 is a cross sectional view taken along a line V-V of FIG. 4.

As shown in FIG. 5, the substrate holder 110 is configured to hold the substrate W within the housing 100. The substrate holder 110 may hold the calibration substrate WA instead of the substrate W. The calibration substrate WA is used to correct the thickness of the substrate W measured by the thickness measurer 140. For example, the substrate holder 110 has a diameter less than half the diameter of the substrate W. The substrate W is held horizontally.

The rotator 120 is configured to rotate the substrate holder 110 around a vertical rotation shaft 121 thereof. The rotator 120 includes a motor 122. For example, a stepping motor is used as the motor 122. The stepping motor has a plurality of coils around a rotation center line, and is configured to rotate the substrate holder 110 by supplying a current to the plurality of coils in sequence. The stepping motor continues to supply the current to a specific coil when the rotation of the substrate holder 110 is stopped.

The mover 130 is configured to move the substrate holder 110 in a horizontal direction (for example, the Y-axis direction) perpendicular to the rotation shaft 121. For example, as shown in FIG. 4, the mover 130 includes a motor 131, and a ball screw 132 configured to change a rotational motion of the motor 131 into a linear motion of the substrate holder 110. The mover 130 has a guide rail 133 extending in the Y-axis direction, and a slider 134 configured to be moved along the guide rail 133. The rotator 120 is fixed to the slider 134. The mover 130 moves the rotator 120 along with the slider 134, thus allowing the substrate holder 110 to be moved.

The thickness measurer 140 is configured to measure the thickness of the substrate W held by the substrate holder 110. The thickness measurer 140 may be used to measure thickness discrepancy in a radial direction of the substrate W. Thickness measurement points are, for example, three: the center of the substrate W, a periphery of the substrate W, and a midpoint between the center and the periphery of the substrate W. The thickness measurement point can be moved in the radial direction of the substrate W by the mover 130. Further, the thickness measurement point can be moved in a circumferential direction of the substrate W by the rotator 120. The thickness measurer 140 may be used to measure thickness discrepancy in the circumferential direction of the substrate W. Further, the thickness measurement point may be moved by moving or rotating the probe 141 of the thickness measurer 140 instead of the substrate holder 110.

The thickness measurer 140 may be of either a contact type or a non-contact type. Desirably, the thickness measurer 140 is of the non-contact type. The thickness measurer 140 is, for example, of a spectral interference type, and is configured to measure the thickness of the substrate W by causing light reflected from the top surface of the substrate W to interfere with light reflected from the bottom surface of the substrate W and analyzing a waveform of an interference wave. The thickness measurer 140 sends the measured data to the controller 190.

Figure 6:
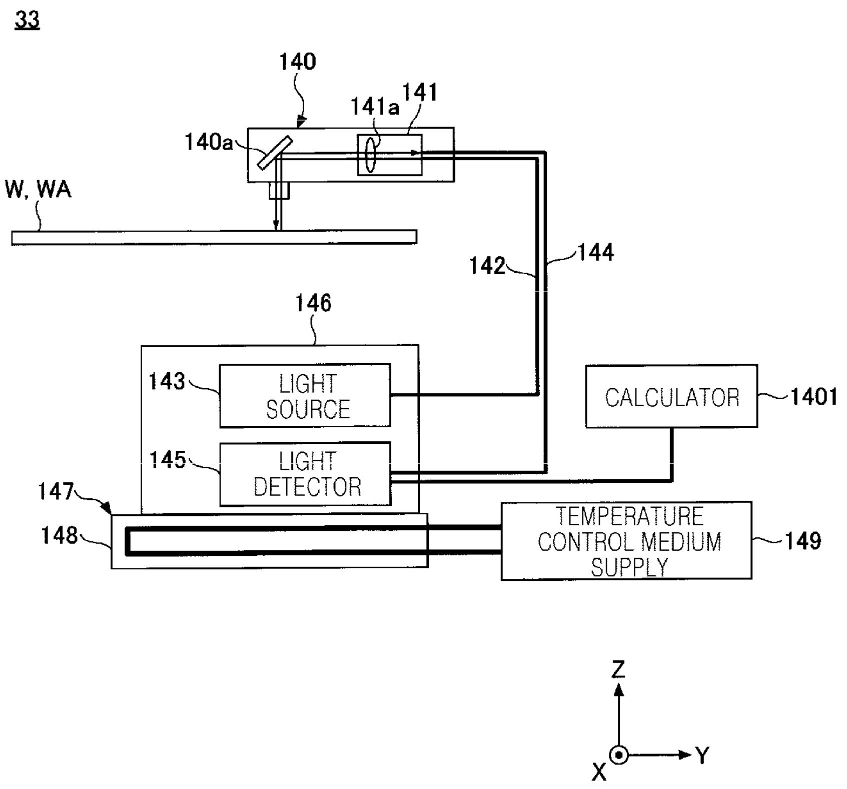
FIG. 6 is a side view illustrating an example of a thickness measurer and a temperature controller.

By way of example, the thickness measurer 140 includes, as illustrated in FIG. 6, the probe 141 configured to radiate light toward the substrate W and receive the light reflected from the substrate W, a light source 143 connected to the probe 141 via an optical fiber 142, a light detector 145 connected to the probe 141 via an optical fiber 144, and a box 146 accommodating therein the light source 143 and the light detector 145. The thickness measurer 140 further includes a calculator 1401 configured to calculate the thickness of the substrate W by analyzing the waveform of the light detected by the light detector 145. The calculator 1401 is provided outside the box 146.

The probe 141 includes a lens 141*a* configured to concentrate light toward the substrate W. The lens 141*a* has, for example, a horizontal optical axis, and a mirror 140*a* is disposed in front of the lens 141*a*. The mirror 140*a* reflects the light downwards toward the substrate W. The mirror 140*a* reflects the light reflected from the substrate W toward the lens 141*a*, guiding it to the optical fiber 144. Here, the mirror 140*a* may be omitted, and the optical axis of the lens 141*a* may be vertically disposed. If, however, the mirror 140*a* is provided, the height of the probe 141 can be lowered, so that the height of the housing 100 can be lowered.

While the probe 141 is disposed inside the housing 100, the box 146 is disposed outside the housing 100. Outside the housing 100, the light source 143 and the light detector 145 are provided. The light source 143 and the light detector 145 are heat sources. By disposing the heat sources outside the housing 100, a temperature fluctuation inside the housing 100 can be suppressed. Thus, a temperature fluctuation of the substrate W can be suppressed, so that measurement accuracy for the thickness of the substrate W can be improved.

A temperature controller 147 is configured to regulate the temperature inside the box 146 to a required temperature. The temperature controller 147 is configured to absorb heat from the heat sources inside the box 146. A heat generation amount of the light source 143 is larger than that of the light detector 145. By using the temperature controller 147, a temperature fluctuation inside the box 146 can be suppressed, so that a temperature fluctuation of the light detector 145 can be suppressed. As a result, it is possible to suppress a fluctuation in the measurement value of the thickness of the substrate W that might be caused by the temperature fluctuation of the light detector 145.

The temperature controller 147 includes, for example, a temperature control plate 148 and a temperature control medium supply 149. The temperature control plate 148 is in contact with a bottom surface of the box 146, for example, and absorbs the heat inside the box 146. Further, the temperature control plate 148 may be disposed inside the box 146. The temperature control medium supply 149 is configured to supply a temperature control medium regulated to a required temperature to the temperature control plate 148. The temperature control medium flows through a flow path inside the temperature control plate 148, while absorbing heat of the temperature control plate 148. After discharged from the temperature control plate 148, the temperature control medium may be cooled in the temperature control medium supply 149 and returned back to the temperature control plate 148.

The alignment device 150 (see FIG. 5) is configured to detect the position of the notch indicating the crystal orientation of the substrate W. In a rotational coordinate system that is rotated along with the substrate holder 110, coordinates of the notch in the radial direction and angular coordinates thereof can be detected. By way of example, the alignment device 150 detects the position of the notch by radiating light to the periphery of the substrate W and receiving the radiated light. Using the alignment device 150 and the thickness measurer 140, a relationship between the crystal orientation of the substrate W and the thickness discrepancy of the substrate W can be investigated. Further, instead of the notch, the orientation flat may be formed on the periphery of the substrate W. The alignment device 150 may detect the position of the orientation flat instead of the notch.

The temperature measurer 160 (see FIG. 4) is configured to measure the temperature inside the housing 100. The temperature measurer 160 transmits the measured data to the controller 190. The humidity measurer 161 is configured to measure the humidity inside the housing 100. The humidity to be measured is, for example, relative humidity. The humidity measurer 161 transmits the measured data to the controller 190. The temperature measurer 160 and the humidity measurer 161 are integrated in FIG. 4, but they may be provided separately.

The exhaust device 170 is configured to exhaust a gas inside the housing 100. Within the housing 100, particles may be generated due to the rotation and the movement of the substrate holder 110. The exhaust device 170 discharges the particles generated inside the housing 100 to the outside of the housing 100 together with the gas to thereby suppress adhesion of the particles to the substrate W. The exhaust device 170 includes, for example, an exhaust duct 171, and an exhaust source 172 connected to the exhaust duct 171. The exhaust duct 171 has, for example, a pair of first exhaust ducts 171*a* and 171*b* extending in the Y-axis direction, and a second exhaust duct 171*c* connecting the pair of first exhaust ducts 171*a* and 171*b*. Each of the pair of first exhaust ducts 171*a* and 171*b* has a plurality of exhaust openings 171*d* that are arranged at a certain distance therebetween in the Y-axis direction. The exhaust source 172 is, for example, a vacuum pump.

The inner cover 180 partitions the interior of the housing 100 as shown in FIG. 5 to suppress an outflow of the particles generated due to the rotation and the movement of the substrate holder 110. The inner cover 180 has, for example, a sidewall 181 in the shape of a square border disposed along a side surface of the housing 100, and a ceiling plate 182 that covers the sidewall 181 from above. The ceiling plate 182 is provided with an opening, which is a movement path of the rotation shaft 121. Below the ceiling plate 182, there are provided the rotator 120, the mover 130, and the exhaust duct 171. Above the top plate 182, the carry-in/out port 101 is provided. By separating the rotator 120 and the like from the carry-in/out port 101 with the ceiling plate 182, the outflow of the particles can be suppressed.

Figure 7:
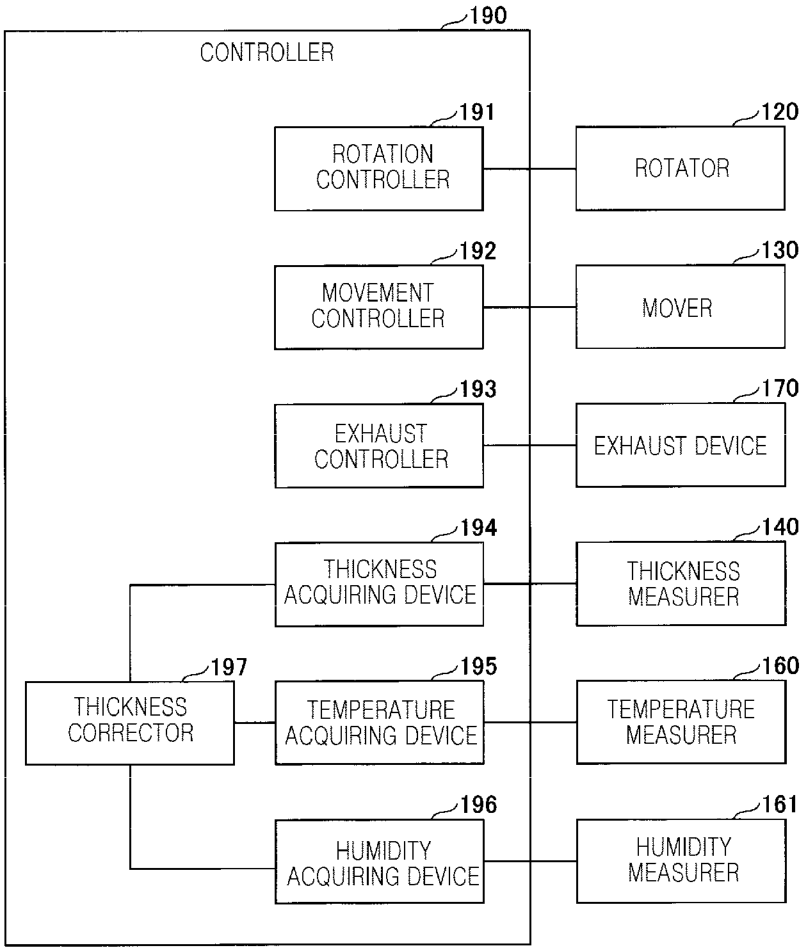
FIG. 7 is a diagram illustrating an example of components of a control device as functional blocks.

Now, with reference to FIG. 7, an example of constituent components of the controller 190 will be described. Individual functional blocks shown in FIG. 7 are conceptual, and may not necessarily need to be physically configured exactly the same as shown in FIG. 7. All or a part of the functional blocks may be functionally or physically dispersed or combined on a unit. All or a part of processing functions performed in the respective functional blocks may be implemented by a program executed by the CPU or implemented by hardware through a wired logic.

The controller 190 is a computer. The controller 190 includes a rotation controller 191, a movement controller 192, an exhaust controller 193, a thickness acquiring device 194, and a temperature acquiring device 195, a humidity acquiring device 196, and a thickness corrector 197, as illustrated in FIG. 7, for example. The rotation controller 191 controls the rotator 120. The movement controller 192 controls the mover 130. The exhaust controller 193 controls the exhaust device 170. The thickness acquiring device 194 acquires the thickness measured by the thickness measurer 140. The temperature acquiring device 195 acquires the temperature measured by the temperature measurer 160. The humidity acquiring device 196 acquires the humidity measured by the humidity measurer 161. The thickness corrector 197 corrects the thickness measured by the thickness measurer 140.

The rotation controller 191 controls a supply current $I_{STOP}$ to the motor 122 when the rotation of the substrate holder 110 is stopped to be equal to or less than 5% to 20% of a supply current $I_{ROTATE}$ to the motor 122 when the substrate holder 110 is rotated. Hereinafter, the supply current $I_{STOP}$ to the motor 122 when the rotation of the substrate holder 110 is stopped is also called stopping current $I_{STOP}$. The supply current $I_{ROTATE}$ to the motor 122 when the substrate holder 110 is rotated also referred to as rotating current $I_{ROTATE}$.

Conventionally, the stopping current $I_{STOP}$ is set to be about 50% of the rotating current $I_{ROTATE}$, and as the amount of heat generated by the motor 122 is large, the amount of heat transferred from the motor 122 to the substrate W via the substrate holder 110 is large. For this reason, a temperature fluctuation of the substrate W is large, so that the measurement accuracy for the thickness of the substrate W is low. In particular, when the substrate holder 110 holds only the central portion of the substrate W, a temperature gradient occurs in the radial direction of the substrate W, resulting in low measurement accuracy for the thickness of the substrate W.

According to the present exemplary embodiment, the rotation controller 191 controls the stopping current $I_{STOP}$ to be equal to or less than 5% to 20% of the rotating current $I_{ROTATE}$. As a result, the heat generation of the motor 122 can be suppressed, so that the temperature fluctuation of the substrate W can be suppressed and the measurement accuracy for the thickness of the substrate W can be improved. In particular, when the substrate holder 110 holds only the central portion of the substrate W, the occurrence of the temperature gradient in the radial direction of the substrate W can be suppressed, so that the measurement accuracy for the thickness of the substrate W can be bettered.

Now, referring to FIG. 8, an example of setting a correction coefficient will be explained. First, the second transfer device 39 takes out the calibration substrate WA from the storage device 61, and carries it into the housing 100 of the substrate thickness measuring device 33 (process S201). The second transfer device 39 hands the calibration substrate WA over to the substrate holder 110, and is retreated to the outside of the housing 100. The substrate holder 110 holds the calibration substrate WA. The calibration substrate WA may have the same diameter, the same thickness, and the same material as the substrate W.

Subsequently, the thickness measurer 140 measures a thickness of the calibration substrate WA (process S202). Before measuring the thickness of the calibration substrate WA, the alignment device 150 may detect a position of a notch of the calibration substrate WA. The position of a thickness measurement point is set in advance, and is adjusted by the rotator 120 and the mover 130 based on the detection result of the alignment device 150.

Then, the thickness corrector 197 sets a ratio t0/t1 of a previously stored standard thickness to of the calibration substrate WA to a thickness t1 of the calibration substrate WA measured in the process S202 as the correction coefficient (process S203). The standard thickness to of the calibration substrate WA is measured by using, for example, a measuring device different from the substrate thickness measuring device 33, and is stored in a recording medium by being matched with the position of the measurement point. When the measurement point is plural in number, the correction coefficient may be obtained for each of the measurement points, or a common correction coefficient may be obtained for the plurality of measurement points. As the correction coefficient in the latter case, an average value of the ratios t0/t1 may be used, for example.

Next, the second transfer device 39 receives the calibration substrate WA from the substrate holder 110, and carries it to the outside of the housing 100 (process S204). The second transfer device 39 transfers the calibration substrate WA to the storage device 61. The storage device 61 stores therein the calibration substrate WA again. Thereafter, the current processing is ended. The process S204 (carry-out of the calibration substrate WA) needs to be performed after the process S202 (measurement of the thickness of the calibration substrate WA), and may be performed prior to the process S203 (setting of the correction coefficient).

The substrate thickness measuring device 33 of the present exemplary embodiment measures the thickness of the substrate W after being etched. In this case, prior to the process S201 (carry-in of the calibration substrate WA) of FIG. 8, the second transfer device 39 takes out the calibration substrate WA from the storage device 61 and transfers it to the etching device 32A or 32B. The calibration substrate WA is washed with pure water by the etching device 32A or 32B to be dried, and then carried into the housing 100 of the substrate thickness measuring device 33 by the second transfer device 39. The thickness t1 of the calibration substrate WA can be measured in the same state as the substrate W, so the ratio t0/t1, which is the correction coefficient, can be set.

Further, by using the temperature measurer 160, the temperature acquiring device 195 acquires a temperature T0 inside the housing 100 when the thickness t1 of the calibration substrate WA is measured, and stores the acquired temperature T0 in the recording medium. Further, by using the humidify measurer 161, the humidity acquiring device 196 acquires a humidity H0 inside the housing 100 when the thickness t1 of the calibration substrate WA is measured, and stores the acquired humidity H0 in the recording medium.

Figure 9:
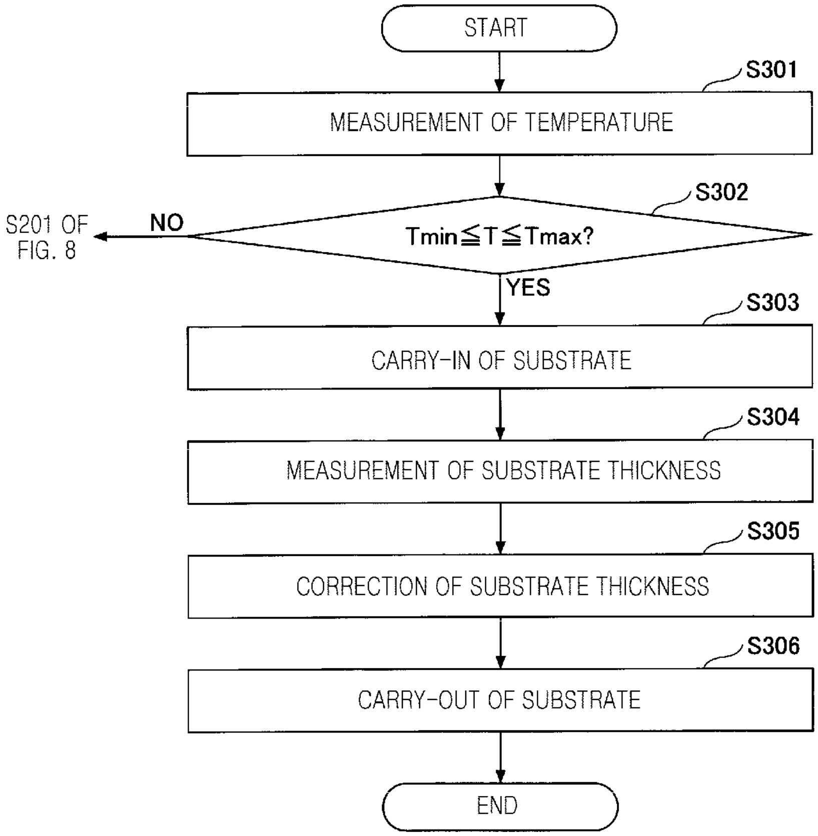
FIG. 9 is a flowchart illustrating an example of correcting a substrate thickness.

Now, referring to FIG. 9, an example of correction of the substrate thickness will be described. First, the temperature acquiring device 195 acquires the temperature T inside the housing 100 by using the temperature measurer 160 (process S301). Then, the thickness corrector 197 checks whether the temperature T acquired by the temperature acquiring device 195 falls within an allowable range (process S302). The allowable range is defined by a lower limit value $T_{min}$ and an upper limit value $T_{max}$. Each of the lower limit value $T_{min}$ and the upper limit value $T_{max}$ is set based on the temperature TO inside the housing 100 when the thickness t1 of the calibration substrate WA is measured, for example, is set through the temperature T0.

If the temperature T acquired by the temperature acquiring device 195 is within the allowable range (process S302, YES), processes S303 to S306 to described later are performed to carry out the measurement and the correction of the thickness of the substrate W.

First, the second transfer device 39 carries the substrate W into the housing 100 of the substrate thickness measuring device 33 (process S303). The second transfer device 39 hands the substrate W over to the substrate holder 110, and is retreated to the outside of the housing 100. The substrate holder 110 holds the substrate W.

Next, the thickness measurer 140 measures a thickness t2 of the substrate W (process S304). Before measuring the thickness t2 of the substrate W, the alignment device 150 may detect the position of the notch of the substrate W. The position of a thickness measurement point is set in advance, and is adjusted by the rotator 120 and the mover 130 based on the detection result of the alignment device 150.

Next, the thickness corrector 197 corrects the thickness t2 of the substrate W measured in the process S304 (process S305). Specifically, the thickness corrector 197 calculates the product (t2×t0/t1) of the thickness t2 measured by the thickness measurer 140 and the preset correction coefficient t0/t1 as a corrected thickness. Accordingly, the measurement accuracy for the thickness of the substrate W can be improved.

Then, the second transfer device 39 receives the substrate W from the substrate holder 110, and carries it to the outside of the housing 100 (process S306). Thereafter, the current processing is ended. The process S306 (carry-out of the substrate W) needs to be performed after the process S304 (measurement of the thickness of the substrate W), and may performed prior to the process S305 (correction of the thickness of the substrate W).

Figure 8:
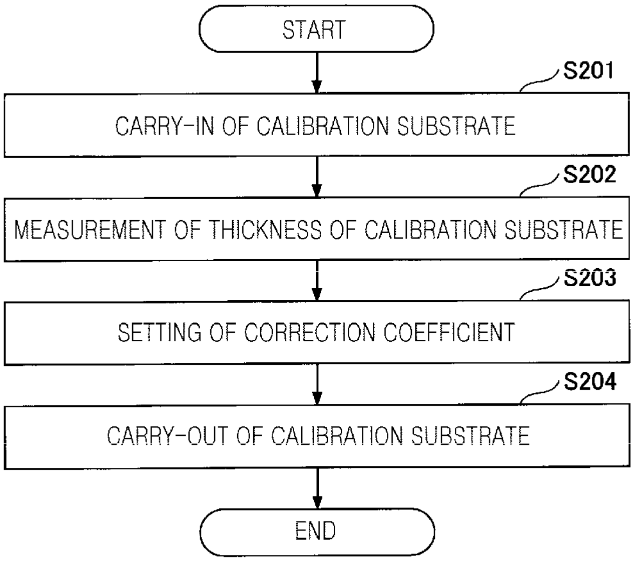
FIG. 8 is a flowchart illustrating an example of setting a correction coefficient.

Meanwhile, when the temperature T acquired by the temperature acquiring device 195 falls out of the allowable range (process S302, NO), the processes S201 to S204 shown in FIG. 8 are performed to calculate the correction coefficient t0/t1 again, and the setting thereof is changed. Afterwards, the processing from the process S301 shown in FIG. 9 is performed again.

According to the present exemplary embodiment, the thickness corrector 197 changes the setting of the correction coefficient when the temperature T measured by the temperature measurer 160 deviates from the preset allowable range, as described above. Afterwards, the thickness corrector 197 corrects the thickness t2 of the substrate W measured by the thickness measurer 140 by using the changed correction coefficient. Thus, since it is possible to change the setting of the correction coefficient appropriately in response to the temperature fluctuation of the substrate W, the measurement accuracy for the thickness of the substrate W can be improved.

Figure 10:
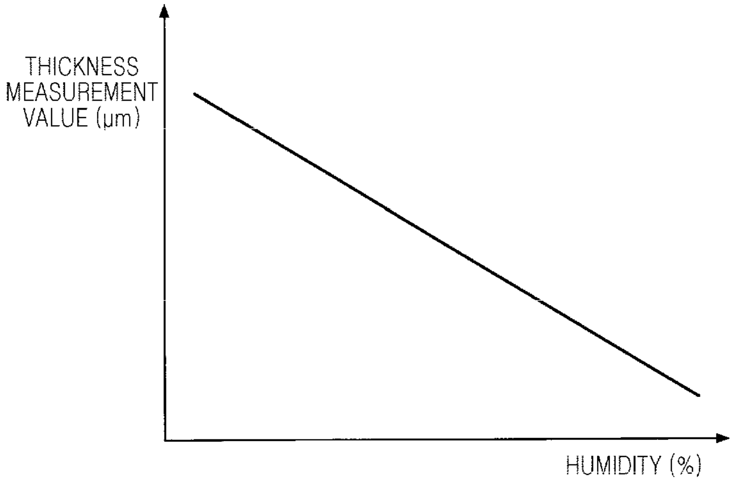
FIG. 10 is a diagram illustrating an example of a variation in a thickness measurement value with respect to a variation in humidity.

The thickness corrector 197 may correct the thickness t2 measured by the thickness measurer 140 based on the humidity measured by the humidity measurer 161. As shown in FIG. 10, the higher the humidity is, the smaller the measured thickness tends to be. This tendency is approximately expressed by a linear equation. A slope a of a variation of the measured thickness with respect to a variation of the humidity is, for example, of a negative value. By correcting the thickness t2 based on the humidity, the measurement accuracy for the thickness t2 can be improved.

For example, the thickness corrector 197 first measures a difference ΔH(ΔH=H−H0) between the humidity H0 inside the housing 100 when the thickness t1 of the calibration substrate WA is measured and the humidity H inside the housing 100 when the thickness t2 of the substrate W is measured. Then, the thickness corrector 197 calculates a product ΔH×a of the different ΔH (=H−H0) and the slope a of the variation of the measured thickness with respect to the variation of the humidity shown in FIG. 10. The thickness corrector 197 calculates a difference (t2−ΔH×a) between the thickness t2 measured by the thickness measurer 140 and the product ΔH×a as the corrected thickness.

Figure 11:
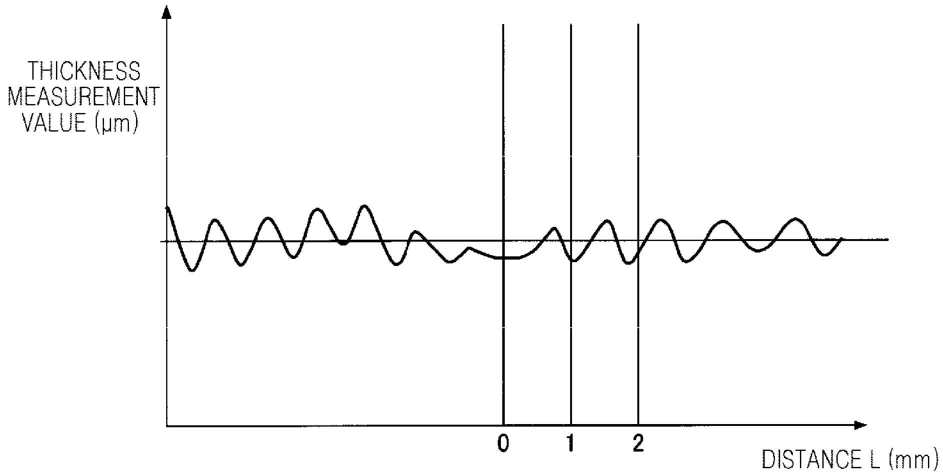
FIG. 11 is a diagram illustrating an example of a variation in a thickness measurement value with respect to a variation in a distance between a probe and a substrate.

Now, with reference to FIG. 11, an example of a variation in a thickness measurement value with respect to a variation in a distance L between the probe 141 and the substrate W will be explained. In FIG. 11, the distance L being zero means that a focus of the lens 141*a* is on the substrate W. As shown in FIG. 11, the farther the distance L is from zero, the more likely the thickness measurement value is to vary.

With the probe 141 fixed, the distance L may vary. Factors causing such variation of the distance L include, by way of example, (1) expansion and contraction of members due to the temperature variation, (2) a variation in thickness between the substrates W, (3) inclination of the guide rail 133, (4) surface accuracy of the substrate holder 110, and (5) self-weight deformation of the substrate W.

In order to minimize a variation range of the thickness measurement value that is caused by the variation in the distance L due to the above-described factors (1) to (5), the probe 141 is provided at a position where the distance L becomes zero. Specifically, the probe 141 is provided at a position where the intensity of the light detected by the light detector 145 is maximum.

Figure 12:
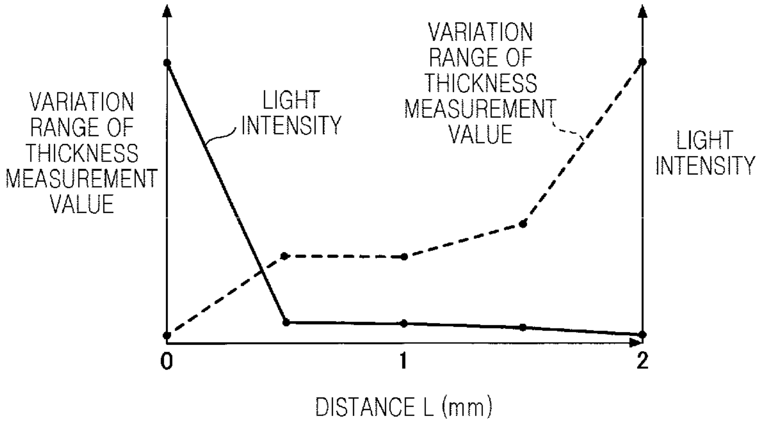
FIG. 12 is a diagram illustrating an example of a variation in intensity of light detected by a light detector and a variation in a variation range of the thickness measurement value with respect to the variation in the distance between the probe and the substrate.

FIG. 12 shows an example of a variation in the intensity of light detected by the light detector 145 and a variation in the variation range of the thickness measurement value with respect a variation in the distance L between the probe 141 and the substrate W. In FIG. 12, the variation range of the thickness measurement value is determined by the aforementioned factors (1) to (5).

As can be clearly seen from FIG. 12, when the probe 141 is provided at the position where the intensity of the light detected by the light detector 145 is maximum, that is, when the distance L is zero, the variation range of the thickness measurement value is minimized. Therefore, the thickness of the substrate W can be measured with high precision.

So far, the exemplary embodiment of the substrate thickness measuring device, the substrate processing system, and the substrate thickness measuring method according to the present disclosure have been described. However, the present disclosure is not limited to the above-described exemplary embodiment or the like. Various changes, corrections, replacements, addition, deletion and combinations may be made within the scope of the claims, and all of these are included in the scope of the inventive concept of the present disclosure.

This application claims priority to Japanese Patent Application No. 2021-130839, filed on Aug. 10, 2021, which application is hereby incorporated by reference in their entirety. According to the exemplary embodiment, it is possible to improve the measurement accuracy for the thickness of the substrate with respect to the temperature variation of the substrate.

We claim:

1. A substrate thickness measuring device, comprising:

a substrate holder configured to hold a substrate;

a thickness measurer configured to measure a thickness of the substrate held by the substrate holder;

a housing accommodating therein the substrate holder and at least a part of the thickness measurer;

a temperature measurer configured to measure a temperature inside the housing; and a controller and a storage storing a computer program, wherein the storage and the computer program are configured, with the controller, to perform operations including:

when the temperature measured by the temperature measurer is within a preset allowable range:

carry the substrate into the housing, measure the thickness of the substrate by the thickness measurer, and calculate, as a corrected thickness, a product of the thickness measured by the thickness measurer and a preset correction coefficient; and when the temperature measured by the temperature measurer is outside the preset allowable range;

carry a calibration substrate into the housing instead of the substrate, and change a setting of the correction coefficient based on a thickness of the calibration substrate measured by the thickness measurer.

2. The substrate thickness measuring device of claim 1, wherein the controller sets, as the correction coefficient, a ratio t0/t1, where t0 is a previously stored standard thickness of the calibration substrate and t1 is a thickness of the calibration substrate measured by the thickness measurer.

3. The substrate thickness measuring device of claim 1, wherein the thickness measurer includes a probe configured to radiate light toward the substrate and receive the light reflected from the substrate, a light source connected to the probe through an optical fiber, a light detector connected to the probe through an optical fiber, and a box accommodating the light source and the light detector therein, and the probe is disposed inside the housing, and the box is disposed outside the housing.

4. The substrate thickness measuring device of claim 3, further comprising:

a temperature controller configured to adjust a temperature inside the box.

5. The substrate thickness measuring device of claim 3, wherein the probe is disposed at a position where intensity of the light detected by the light detector becomes maximum.

6. The substrate thickness measuring device of claim 1, further comprising:

a motor configured to rotate the substrate holder, and wherein the controller is further configured to control the motor, wherein the controller controls a supply current supplied to the motor when a rotation of the substrate holder is stopped to be equal to or less than 5% to 20% or less of a supply current supplied to the motor when the substrate holder is rotated.

7. The substrate thickness measuring device of claim 1, further comprising:

a humidity measurer configured to measure a humidity inside the housing, wherein the controller corrects the thickness measured by the thickness measurer based on the humidity measured by the humidity measurer.

8. A substrate processing system, comprising:

a substrate thickness measuring device as claimed in claim 1;

an etching device configured to etch the substrate; and a transfer device configured to transfer the substrate to the substrate thickness measuring device and the etching device, wherein the transfer device transfers the substrate after being etched, cleaned and dried in the etching device to the substrate thickness measuring device.

9. A substrate processing system, comprising:

a substrate thickness measuring device as claimed in claim 1;

a storage device configured to accommodate the calibration substrate therein; and a transfer device configured to transfer the calibration substrate to the substrate thickness measuring device and the storage device.

10. The substrate processing system of claim 9, further comprising:

an etching device configured to etch the substrate, wherein the transfer device transfers the substrate after being etched, cleaned and dried in the etching device and the calibration substrate after being cleaned and dried in the etching device to the substrate thickness measuring device.

11. A substrate thickness measuring method of measuring a thickness of a substrate by using a substrate thickness measuring device equipped with a substrate holder configured to hold the substrate; a thickness measurer configured to measure a thickness of the substrate held by the substrate holder; a housing accommodating therein the substrate holder and at least a part of the thickness measurer; and a temperature measurer configured to measure a temperature inside the housing, the substrate thickness measuring method comprising:

when the temperature measured by the temperature measurer is within a preset allowable range:

carrying the substrate into the housing, measuring the thickness of the substrate by the thickness measurer, and calculating, as a corrected thickness, a product of the thickness measured by the thickness measurer and a preset correction coefficient; and when the temperature measured by the temperature measurer is outside the preset allowable range:

carrying a calibration substrate into the housing instead of the substrate, and changing a setting of the correction coefficient based on a thickness of the calibration substrate measured by the thickness measurer.

* * * * *